(12) United States Patent
Kropewnicki et al.

(10) Patent No.: US 7,648,914 B2
(45) Date of Patent: Jan. 19, 2010

(54) METHOD FOR ETCHING HAVING A CONTROLLED DISTRIBUTION OF PROCESS RESULTS

(75) Inventors: Thomas J. Kropewnicki, San Mateo, CA (US); Theodoros Panagopoulos, Cupertino, CA (US); Nicolas Gani, Milpitas, CA (US); Wilfred Pau, Santa Clara, CA (US); Meihua Shen, Fremont, CA (US); John P. Holland, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 662 days.

(21) Appl. No.: 11/367,004

(22) Filed: Mar. 2, 2006
(Under 37 CFR 1.47)

(65) Prior Publication Data
US 2007/0042603 A1 Feb. 22, 2007

Related U.S. Application Data

(63) Continuation-in-part of application No. 11/246,012, filed on Oct. 7, 2005, which is a continuation-in-part of application No. 10/960,874, filed on Oct. 7, 2004, now Pat. No. 7,544,251.

(60) Provisional application No. 60/658,698, filed on Mar. 3, 2005.

(51) Int. Cl.
*H01L 21/302* (2006.01)

(52) U.S. Cl. .................. 438/689; 216/59; 257/E21.312; 257/E21.525

(58) Field of Classification Search ....................... None
See application file for complete search history.

(56) References Cited

U.S. PATENT DOCUMENTS 6,035,101 A 3/2000 Sajoto et al.
(Continued)

FOREIGN PATENT DOCUMENTS

CN 2585414 Y 11/2003
(Continued)

OTHER PUBLICATIONS

Second Office Action for Chinese Application No. 200510116536.0, May 30, 2008, consists of seven pages (1-3 and 1-4)—provides a concise explanation of relevance for B1.
(Continued)

*Primary Examiner*—Allan Olsen
(74) *Attorney, Agent, or Firm*—Patterson & Sheridan, LLP

(57) ABSTRACT

Embodiments of the invention generally provide methods for etching a substrate. In one embodiment, the method includes determining a substrate temperature target profile that corresponds to a uniform deposition rate of etch by-products on a substrate, preferentially regulating a temperature of a first portion of a substrate support relative to a second portion of the substrate support to obtain the substrate temperature target profile on the substrate, and etching the substrate on the preferentially regulated substrate support. In another embodiment, the method includes providing a substrate in a processing chamber having a selectable distribution of species within the processing chamber and a substrate support with lateral temperature control, wherein a temperature profile induced by the substrate support and a selection of species distribution comprise a control parameter set, etching a first layer of material and etching a second layer of material respectively using different control parameter sets.

20 Claims, 9 Drawing Sheets

U.S. PATENT DOCUMENTS

| | | |
|---|---|---|
| 6,256,187 B1 | 7/2001 | Matsunaga et al. |
| 6,310,755 B1 | 10/2001 | Kholodenko et al. |
| 6,482,747 B1 * | 11/2002 | Takahashi et al. ........... 438/715 |
| 6,589,437 B1 * | 7/2003 | Collins ......................... 216/68 |
| 6,664,738 B2 | 12/2003 | Arai et al. |
| 6,853,533 B2 | 2/2005 | Parkhe |
| 7,221,553 B2 | 5/2007 | Nguyen et al. |
| 2002/0021545 A1 | 2/2002 | Tatsumi et al. |
| 2002/0050246 A1 | 5/2002 | Parkhe |
| 2002/0170882 A1 | 11/2002 | Akiba |
| 2003/0155079 A1 | 8/2003 | Bailey et al. |
| 2003/0164226 A1 | 9/2003 | Kanno et al. |
| 2003/0230239 A1 * | 12/2003 | Shan ........................... 118/715 |
| 2003/0230551 A1 * | 12/2003 | Kagoshima et al. ........... 216/72 |
| 2004/0061449 A1 | 4/2004 | Arai et al. |
| 2004/0185670 A1 * | 9/2004 | Hamelin et al. ............. 438/704 |
| 2004/0187787 A1 | 9/2004 | Dawson et al. |
| 2004/0195216 A1 | 10/2004 | Strang |
| 2004/0241342 A1 * | 12/2004 | Karim et al. ................ 427/585 |
| 2004/0261721 A1 | 12/2004 | Steger |
| 2005/0042881 A1 | 2/2005 | Nishimoto et al. |
| 2006/0076108 A1 | 4/2006 | Holland et al. |
| 2006/0076109 A1 | 4/2006 | Holland et al. |
| 2006/0158821 A1 | 7/2006 | Miyashita |
| 2007/0102118 A1 | 5/2007 | Holland et al. |
| 2007/0139856 A1 | 6/2007 | Holland et al. |
| 2007/0258186 A1 | 11/2007 | Matyushikin et al. |

FOREIGN PATENT DOCUMENTS

| | | |
|---|---|---|
| JP | 091770 A | 1/1997 |
| JP | 10209257 A | 8/1998 |
| JP | 2002009064 A | 1/2002 |
| JP | 2003243490 A | 8/2003 |
| WO | WO-2006022997 A2 | 3/2006 |

OTHER PUBLICATIONS

Wait, R.K.. Monitoring residual and process gases in PVD processes: The importance of sensitivity. Micromagazine, Jun. 1997.

Korean Office Action corresponding to Patent Application No. 10-2007-7021429 dated Aug. 29, 2008.

Translation of Chinese Office Action for CN Application No. 200510116536.0, consists of 10 unnumbered pages, Aug. 2007.

Claims co-pending U.S. Appl. No. 11/740,869, filed Apr. 26, 2007.

Claims co-pending U.S. Appl. No. 11/778,019, filed Jul. 14, 2007.

International Search Report for PCT/US 06/07525, Aug. 2007.

Notice of Reasons For Rejection letter of Japanese Application No. 2005-295533, dated Jul. 7, 2009.

* cited by examiner

METHOD FOR ETCHING HAVING A CONTROLLED DISTRIBUTION OF PROCESS RESULTS

CROSS-REFERENCE TO RELATED APPLICATIONS

This application is a continuation-in-part of co-pending U.S. patent application Ser. No. 11/246,012, filed on Oct. 7, 2005, which is a continuation-in-part application of U.S. patent application Ser. No. 10/960,874, Oct. 7, 2004 (now U.S. Pat. No. 7,544,251), which is incorporated by reference herein. This application also claims benefit from U.S. Provisional Patent Application Ser. No. 60/658,698 filed Mar. 3, 2005, which is incorporated by reference herein.

BACKGROUND OF THE INVENTION

1. Field of the Invention

Embodiments of the present invention generally relate to a method of etching. More specifically, the invention relates to a method for etching having a controlled distribution of process results.

2. Background

In manufacture of integrated circuits, precise control of various process parameters is required for achieving consistent results within a substrate, as well as the results that are reproducible from substrate to substrate. During processing, changes in the temperature and temperature gradients across the substrate may be detrimental to material deposition, etch rate, step coverage, feature taper angles, and other parameters of semiconductor devices. As such, generation of the predetermined pattern of temperature distribution across the substrate is one of critical requirements for achieving high yield.

The 2003 edition of the International Technology Roadmap for Semiconductors states that reduction in the transistor gate critical dimension (CD) will be a key challenge for etch technology in the future. Therefore, much work has been done to study the influence of gate etch process parameters on the ability to control CD's, since the gate CD contributes significantly to the ultimate performance of a device. Several different strategies for gate CD control have been published, including photoresist trimming and control of the gate hard mask etch chemistry. The former approach reduces the photoresist dimension below what is possible lithographically by lateral etching of the photoresist, while the latter approach relies on etch by-products redeposited on the sidewalls during the hard mask etch to passivate and control the amount of lateral etching relative to vertical etching. Sidewall passivation by etch by-products is not limited only to the hard mask etch step, but also occurs during the gate main etch, soft landing, and over etch steps.

The rate of this redeposition of etch by-products is expected to follow both the gas phase concentration of by-products and the sticking coefficient of those by-products. Sticking coefficients have been used in gas-surface reaction mechanisms to describe the probability of an incident gas phase species adsorbing to a surface, and they are typically approximated as the ratio of the number of species that are reactively adsorbed on a surface to the total number of incident species.

However, conventional substrate pedestals have insufficient means for controlling substrate temperature distribution across the diameter of the substrate. The inability to control substrate temperature uniformity has an adverse effect on process uniformity both within a single substrate and between substrates, device yield and overall quality of processed substrates.

Therefore, there is a need in the art for an improved method for etching a substrate.

SUMMARY OF THE INVENTION

Embodiments of the invention generally provide methods for etching a substrate. In one embodiment, the method for etching a substrate includes determining a substrate temperature target profile that corresponds to a uniform deposition rate of etch by-products on a substrate, preferentially regulating a temperature of a first portion of a substrate support relative to a second portion of the substrate support to obtain the substrate temperature target profile on the substrate, and etching the substrate on the preferentially regulated substrate support.

In another embodiment, the method includes providing a first process control knob to effect a first process condition, wherein the first process condition is represented by a first distribution of process results; providing a second process control knob to effect a second process condition, wherein the second process condition is represented by a second distribution of process results; setting both of the first and second process control knobs to a predetermined setting to produce a third distribution of process results, wherein the third distribution of process results is different from the first and second distributions of process results; and, etching a substrate disposed on a substrate support in a processing chamber having the first and second process control knobs set to the predetermined setting, wherein the first process control knob selects locations of gas injection into the processing chamber, and the second process control knob selects a temperature profile of the substrate support.

In yet another embodiment, the method includes providing a substrate in a processing chamber having a selectable distribution of species within the processing chamber and a substrate support with lateral temperature control, wherein a temperature profile induced by the substrate support and a selection of species distribution comprise a control parameter set, etching a first layer of material using a first control parameter set, and etching a second layer of material using a second control parameter set, wherein the first and second control parameter sets are different.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
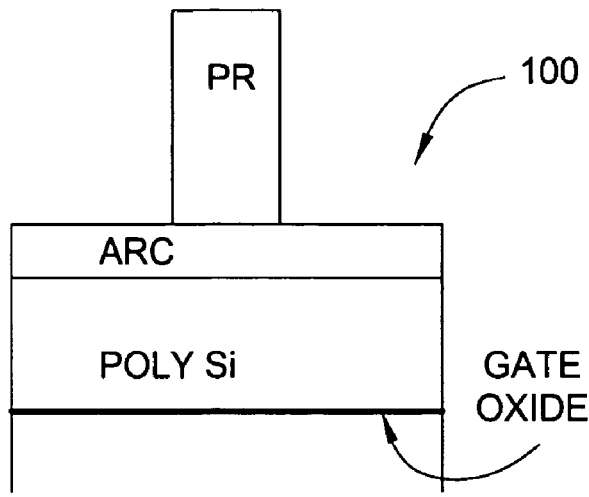
FIGS. 1A-B are a schematic of the gate etch process.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Figure 1B:
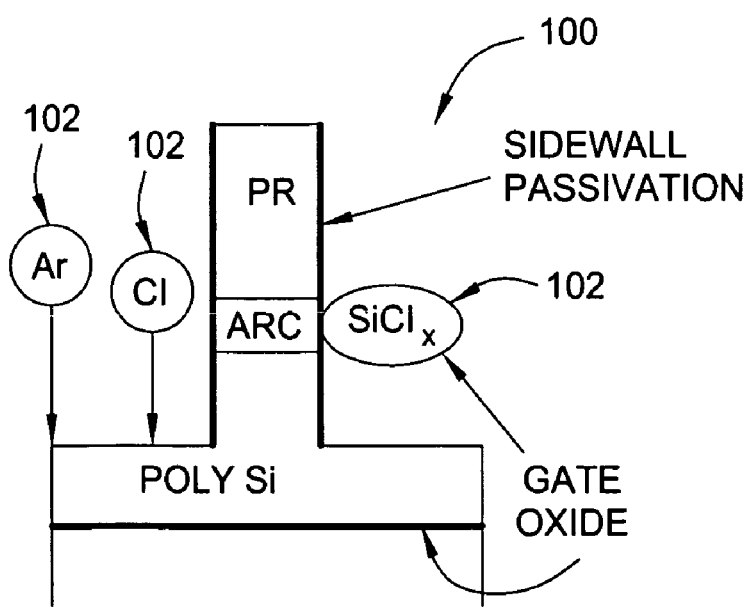

A schematic of the gate etch process is shown in FIGS. 1A-B. We have experimentally observed a strong dependence of gate etch CD bias on the substrate temperature, and now disclose this relationship, and demonstrate the dependence of the gate etch by-product sticking coefficient on substrate temperature which has enabled the control of process result distribution across a substrate.

The rate of this redeposition of etch by-products is expected to follow both the gas phase concentration of by-products and the sticking coefficient of those by-products. Sticking coefficients have been used in gas-surface reaction mechanisms to describe the probability of an incident gas phase species 102 adsorbing to a surface (shown as a gate structure 100) and they are typically approximated as the ratio of the number of species that are reactively adsorbed on a surface to the total number of incident species. Analysis of the dependence of the sticking coefficient on surface temperature has been used to describe impurity levels during the epitaxial growth of silicon films and the step coverage deposition behavior of silicon dioxide on substrates. Both models relate the sticking coefficient to the competition between the adsorption, desorption, and reaction rates for the gas phase species on the surface. Therefore, negative values of the sticking coefficient can be interpreted as etch yields. Using the equations of Bennet et al., combined with Langmuir adsorption theory, the temperature dependence of s* can be expressed as $$s^*(T) = \frac{R_{ads(eff)}\sqrt{2\pi MRT}}{PN_A \exp\left(-\frac{E_{eff}}{kT}\right)} \quad (1)$$

where P is the partial pressure of the etch by-products, $N_A$ is the Avogadro number, M is the molecular weight of the adsorbing species, R is the universal gas constant, T is the temperature, and $E_{eff}$ is the difference between the energies for desorption and the surface reaction. It is assumed that the etch by-products redeposit equally on any surface site regardless of previous history, so surface coverage can be neglected. This assumption is reasonable since the observed thicknesses of passivating layers during gate etch are typically greater than that of a single monolayer.

Two important etch process parameters that can be extracted directly from Eq. (1) are the flux of species to the surface and the substrate temperature. Both of these tunable recipe parameters are likely to have a significant impact on the sticking coefficient of passivating species on the gate sidewalls, and hence, the gate CD bias after etching. The obvious complication in using Eq. (1) is the $R_{ads}$ term, which is not easily determined and has some temperature dependence itself. For this analysis, the $R_{ads}$ term will be used as a fitting parameter and will be further explained later.

To test the influence of the species flux and substrate temperature on the gate etch process, patterned substrates with a poly-silicon gate stack were generated. The photomask used to pattern the substrates was designed for the 90 nm technology node. Etch experiments were carried out in an Applied Centura® DPS® Etch system configured with a DPS II Silicon Etch chamber. The substrates were etched using a four step process (breakthrough, main etch, soft landing, and over etch) using standard gate etch chemistries. Pre and post etch CD's were measured on an Applied VeraSEM® Metrology system.

Figure 2:
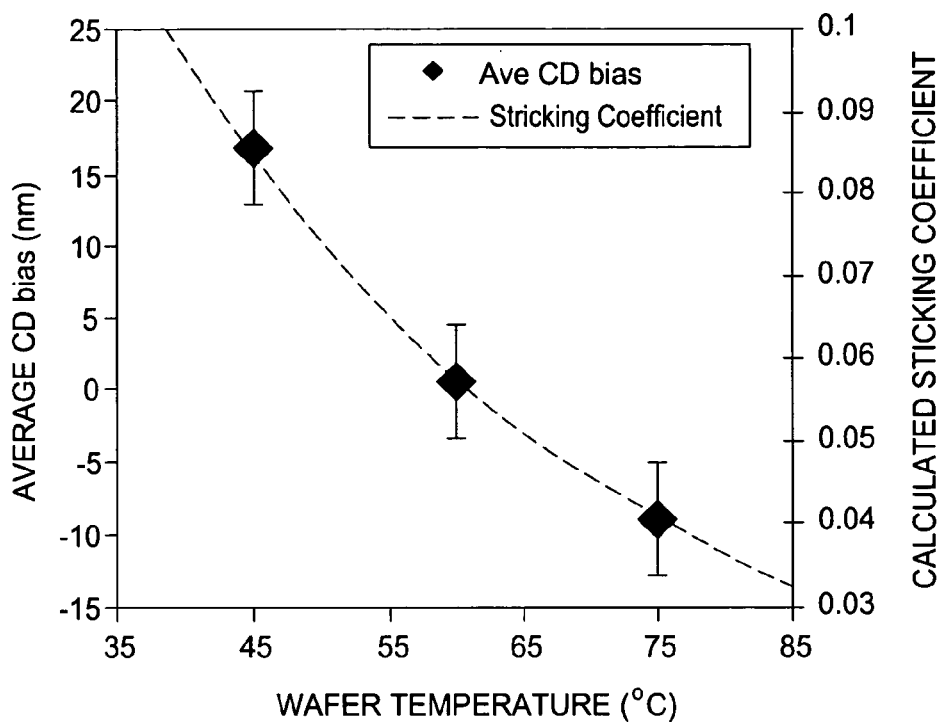
FIG. 2 is a graph illustrating a relationship between average CD bias, substrate temperature and calculated sticking coefficient.

The impact of substrate temperature on average CD bias (where CD bias is defined as post etch CD—pre etch CD) can be seen clearly in FIG. 2. The data show that increasing substrate temperature results in the average gate linewidth becoming narrower, which is consistent with the theory of fewer passivating species on the gate sidewall at higher temperatures. The best fit curve for the sticking coefficient shown in FIG. 2 closely tracks the average CD bias data and was calculated using Eq. (1) where $E_{eff}$ was assumed to be 0.250 eV and $R_{ads}$=9E13 atoms/cm²s. To ensure that this value of the fitting parameter, $R_{ads}$, is reasonable, an independent calculation of $R_{ads}$ can be made using the CD bias data as shown in Eq. (2):

$$R_{ads} = \frac{(CDBias)\rho N_A}{2Mt} \quad (2)$$

Indeed, the average value for $R_{ads}$ obtained with Eq. (2) agree well with the value obtained through the fitting procedure for the temperature range under consideration. The relationship between the average CD bias of these three runs and the substrate temperature indicates an average rate of change of −0.8607 nm/° C. The corresponding percentage change in sticking coefficient, s*, would be −0.2%/° C. The calculated range of sticking coefficients shown in FIG. 2 is also consistent with values obtained for $CF_2$ radicals incident on a powered Si electrode.

The one sigma error bars on the CD bias averages in FIG. 2 are a measure of the within substrate CD bias nonuniformity. The degree of nonuniformity is consistent for all three substrate temperatures, with the observed linewidths at the edge regions typically being smaller than those in the center region. Measurements of within substrate temperature uniformities have indicated that the substrate temperature range is less than ±1 ° C. for conditions similar to these runs, suggesting that the observed within substrate linewidth nonuniformity in these cases is due to something in addition to the substrate temperature.

Figure 3:
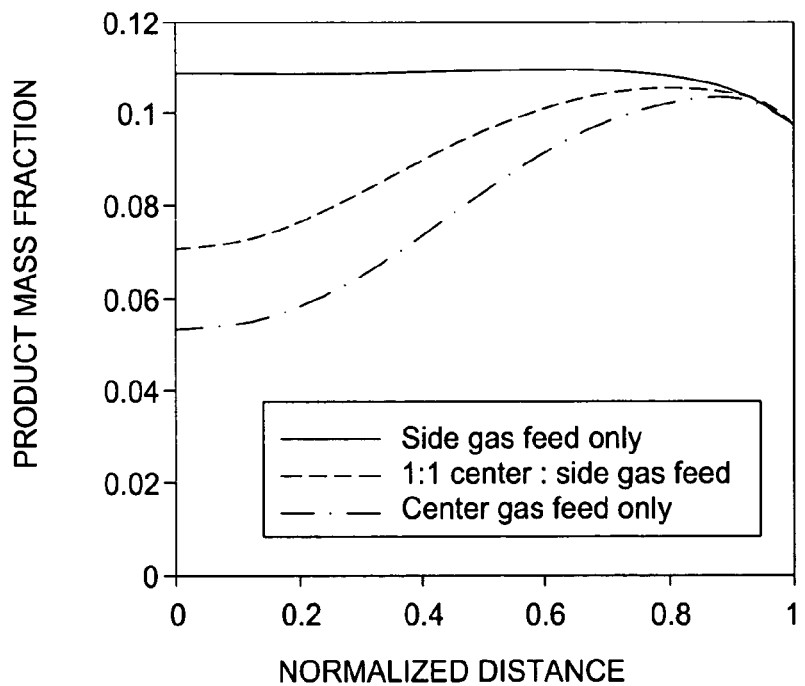
FIG. 3 is a graph illustrating a relationship between process mass fraction and normalized distance.

Previous work has demonstrated that a decrease in CD bias at the substrate edge can be caused by a decrease in by-product concentration in this region of the substrate. This concentration gradient is produced by a more efficient removal of the etch by-products at the substrate edge relative to the substrate center. As a result, the local adsorption rate at the substrate edge is decreased in the immediate vicinity of the adsorption site, i.e., the gate sidewall, for a given substrate temperature. This local partial pressure of passivating species can be controlled in part by the location of feed gas injection into the chamber. FIG. 3 shows simulation results comparing three different gas injection schemes. When gas is injected at the top of the chamber in a direction normal to the substrate surface (labeled center gas feed in FIG. 3), the density of precursor species actually decreases in the center due to the increase in gas velocity as a result of increased convective flow. On the contrary, when gas is injected at the top of the chamber in a direction parallel to the substrate surface (labeled side gas feed in FIG. 3), the flow to the substrate surface is more diffusive, and a more uniform distribution of precursor species results.

Figure 4:
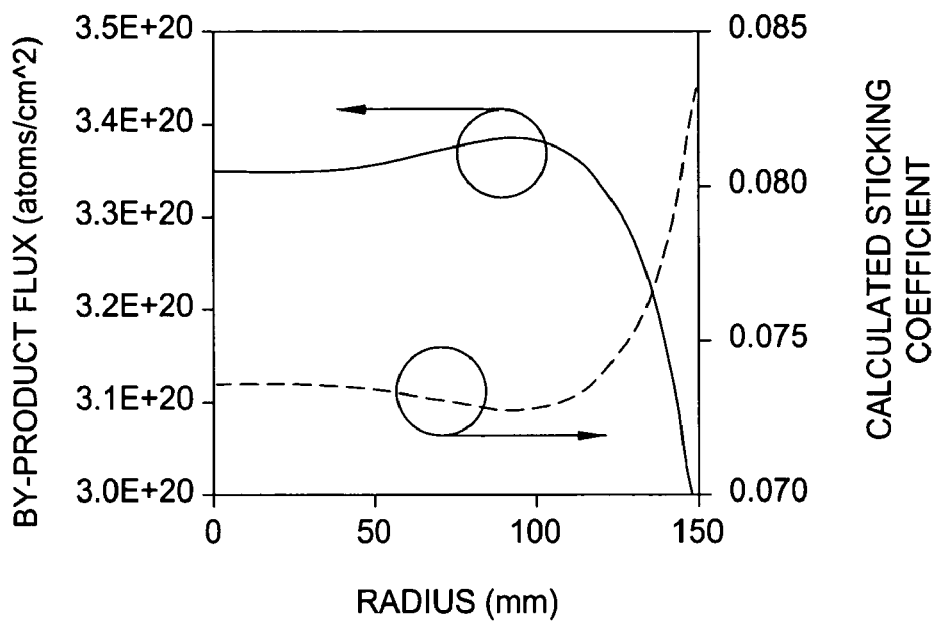
FIG. 4 is a graph illustrating a relationship between etch by-product flux and substrate radius.

Using the relationship between substrate temperature and sticking coefficient as well as knowledge of the etch by-product distribution within the etch chamber, within substrate CD bias uniformity can be optimized by introducing multiple temperature zones in the electrostatic chuck (ESC). The radial distribution of the etch by-products for a typical gate etch process and the corresponding radial requirement for sticking coefficient are shown in FIG. 4. Since the change in sticking coefficient with temperature is approximately linear for small temperature ranges, the predicted temperature profile will mirror the local gas phase species concentration quite closely. Therefore, the desired substrate temperature is required to be lower for the edge region of the substrate to compensate for the decrease in passivating species caused by pumping. In effect, this local substrate surface temperature decrease increases the sticking coefficient of the passivating species to maintain a constant and uniform flux of adsorbed species to the substrate surface, and hence, uniform gate linewidths.

Figure 5:
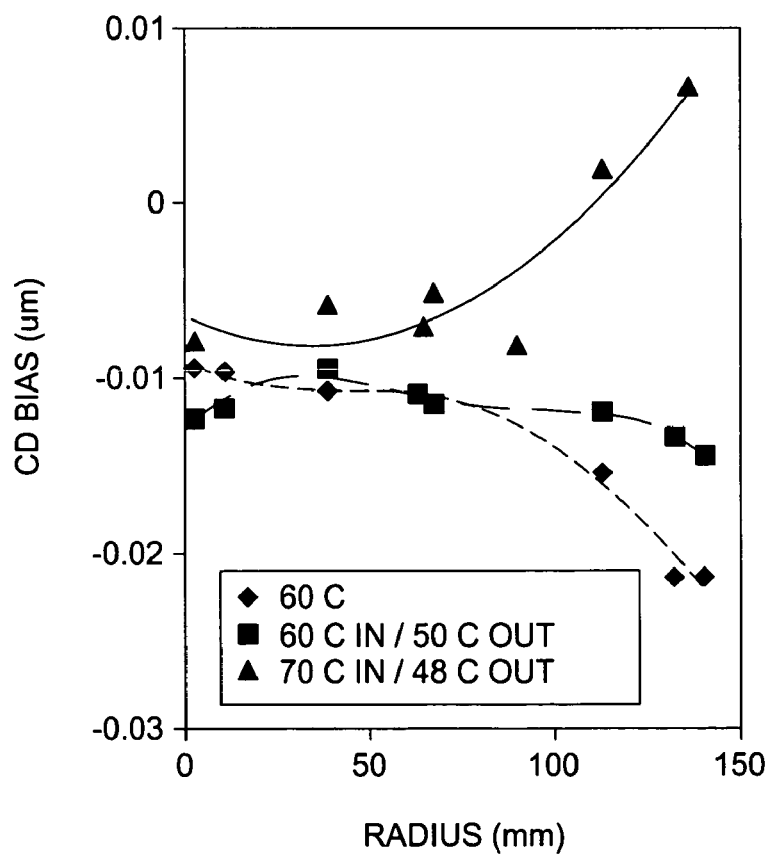
FIG. 5 is a graph illustrating a relationship between CD bias and substrate radius.

FIG. 5 shows three cases: a substrate at uniform temperature, an optimized condition with a dual-zone ESC, and an intentionally mistuned process to demonstrate the ability to control CD bias across the substrate. Whereas smaller gate linewidths at the substrate edge are observed in FIG. 5 for the uniform substrate temperature condition, a marked improvement in center to edge CD bias uniformity can be achieved when the temperature of the ESC is divided into two zones, where the outer zone is at a lower temperature than the inner zone. The range of CD bias for the ESC at uniform temperature is 15.3 nm, and the range of CD bias for the dual zone ESC is 9.5 nm, an improvement of 37.9%. The third case shows the condition of an exaggerated center to edge substrate temperature difference, which results in the CD bias being intentionally tuned toward positive values to demonstrate the ability to control CD bias with substrate temperature. At the lowest substrate temperatures, more by-products absorb on the sidewalls and result in an inverse effect where the edge linewidths become larger than those of the substrate center.

In summary, it has been shown that equilibrium adsorption theory can be used to help explain observed trends in CD bias uniformity during the transistor gate etch process. In particular, the temperature dependence of the sticking coefficient of etch by-products is significant. Therefore, an ESC with multiple, independently controllable temperature zones, such as found in the DPS II Silicon Etch chamber, is most desirable for critical etch applications such as gate etch. It is likely that similar phenomena occur during other etch applications where sidewall passivation is critical to CD performance, such as the etching of aluminum lines or the dielectric etching of contacts and vias.

The etch processes described herein may be performed in any suitably adapted plasma etch chamber, for example, a HART etch reactor, a HART TS etch reactor, a Decoupled Plasma Source (DPS), DPS-II, or DPS Plus, or DPS DT etch reactor of a CENTURA® etch system, all of which are available from Applied Materials, Inc. of Santa Clara, Calif. Plasma etch chambers from other manufacturers may also be adapted to perform the invention. The DPS reactor uses a 13.56 MHz inductive plasma source to generate and sustain a high density plasma and a 13.56 MHz source bias power to bias a substrate. The decoupled nature of the plasma and bias sources allows independent control of ion energy and ion density. The DPS reactor provides a wide process window over changes in source and bias power, pressure, and etchant gas chemistries and uses an endpoint system to determine an end of the processing.

Figure 6:
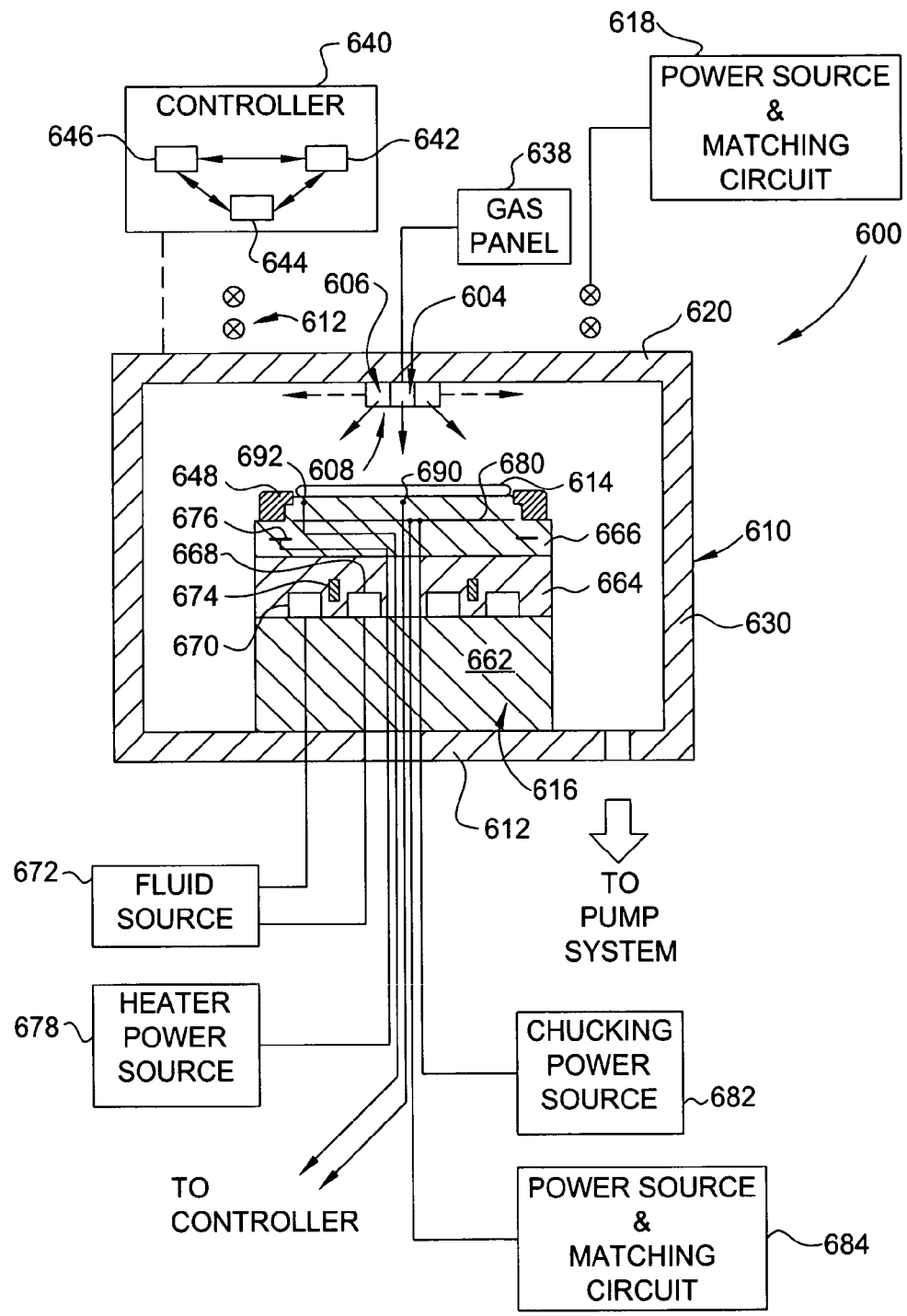
FIG. 6 is a schematic diagram of an exemplary semiconductor substrate processing chamber in accordance with one embodiment of the invention.

FIG. 6 depicts a schematic diagram of an exemplary etch reactor 600 that may illustratively be used to practice the invention. The particular embodiment of the etch reactor 600 shown herein is provided for illustrative purposes and should not be used to limit the scope of the invention.

Etch reactor 600 generally includes a process chamber 610, a gas panel 638 and a controller 640. The process chamber 610 includes a conductive body (wall) 630 and a ceiling 620 that enclose a process volume. Process gasses are provided to the process volume of the chamber 610 from the gas panel 638.

The controller 640 includes a central processing unit (CPU) 644, a memory 642, and support circuits 646. The controller 640 is coupled to and controls components of the etch reactor 600, processes performed in the chamber 610, as well as may facilitate an optional data exchange with databases of an integrated circuit fab.

In the depicted embodiment, the ceiling 620 is a substantially flat member. Other embodiments of the process chamber 610 may have other types of ceilings, e.g., a dome-shaped ceiling. Above the ceiling 620 is disposed an antenna 612 comprising one or more inductive coil elements (two co-axial coil elements are illustratively shown). The antenna 612 is coupled to a matching network and radio-frequency (RF) plasma power source 618. Power is applied to the antenna 612 and inductively coupled to a plasma formed in the chamber 100 during processing. The chamber 100 may alternatively utilize capacitive plasma coupling using a power source 684, as described further below.

The gas panel 638 is coupled to one or more nozzles so that the flow through into the chamber may be controlled to control the distribution of species within the chamber. The one or more nozzles are configured and/or arranged to effect at least one of the process gas flow location, flow orientation of the process gas or species distribution within the chamber.

In one embodiment, a nozzle 608 having at least two outlet ports 604, 606 is provided coupled to the ceiling 620 of the chamber body 610. The outlet ports 604, 606 configured to respectively induce a direct and indirect orientation of gas flow into the chamber. For example, the first outlet port 604 may provide a direct gas flow orientation, i.e., produce a gas flow entering the chamber oriented substantially normal to the surface. The second outlet port 606 may provide an indirect gas flow orientation, i.e., produce a gas flow entering the chamber oriented substantially parallel to the surface, or in another embodiment, directed at an incidence angle of less than or equal to 60 degrees relative to a plane of the substrate. It is contemplated that one or more of the outlet ports 604, 606 may be disposed in other regions of the chamber and that the outlet ports 604, 606 may be disposed on separate nozzles 608 (i.e., one port per nozzle).

A pedestal assembly 616 is disposed in the interior volume 606 of the processing chamber 600 below the nozzle 608. The pedestal assembly 616 holds the substrate 614 during processing. The pedestal assembly 616 generally includes a plurality of lift pins (not shown) disposed therethrough that are configured to lift the substrate from the pedestal assembly 616 and facilitate exchange of the substrate 614 with a robot (not shown) in a conventional manner.

In one embodiment, the pedestal assembly 616 includes a mounting plate 662, a base 664 and an electrostatic chuck 666. The mounting plate 662 is coupled to the bottom 612 of the chamber body 630 and includes passages for routing utilities, such as fluids, power lines and sensor leads, among others, to the base 664 and chuck 666.

At least one of the electrostatic chuck 666 or base 664 includes at least one optional embedded heater 676, at least one optional embedded isolator 674, and a plurality of conduits fluidly coupled to a fluid source 672 that provides a temperature regulating fluid therethrough. In the embodiment depicted in FIG. 6, one heater 676 is illustratively shown in the electrostatic chuck 666 coupled to a power supply 678 while two conduits 668, 670 separated by one annular isolator 674 are shown in the base 664. The conduits 668, 670 and heater 676 may be utilized to control the temperature of the pedestal assembly 616, thereby heating and/or cooling the electrostatic chuck 666, thereby controlling, at least in part, the temperature of a substrate 614 disposed on the electrostatic chuck 666.

The two separate cooling passages 668, 670 formed in the base 664 define at least two independently controllable temperature zones. It is contemplated that additional cooling passages and/or the layout of the passages may be arranged to define additional temperature control zones. In one embodiment, the second cooling passage 668 is arranged radially inward of the second cooling passage 670 such that the temperature control zones are concentric. It is contemplated that the passages 668, 670 may radially orientated, or have other geometric configurations. The cooling passages 668, 670 may be coupled to a single source 672 of a temperature controlled heat transfer fluid, or may be respectively coupled to a separate heat transfer fluid source.

The isolator 674 is formed from a material having a different coefficient of thermal conductivity than the material of the adjacent regions of the base 664. In one embodiment, the isolator 674 has a smaller coefficient of thermal conductivity than the base 664. In the embodiment depicted in FIG. 6, the base 664 is formed from aluminum or other metallic material. In a further embodiment, the isolator 674 may be formed from a material having an anisotropic (i.e. direction-dependent coefficient of thermal conductivity). The isolator 674 functions to locally change the rate of heat transfer between the pedestal assembly 616 through the base 664 to the conduits 668, 670 relative to the rate of heat transfer though neighboring portions of the base 664 not having an isolator in the heat transfer path. An isolator 674 is laterally disposed between the first and second cooling passages 668, 670 to provide enhanced thermal isolation between the temperature control zones defined through the pedestal assembly 616.

In the embodiment depicted in FIG. 6, the isolator 674 is disposed between the conduits 668, 670, thereby hindering lateral heat transfer and promoting lateral temperature control zones across the pedestal assembly 616. Thus, by controlling the number, shape, size, position and coefficient of heat transfer of the inserts, the temperature profile of the electrostatic chuck 666, and the substrate 614 seated thereon, may be controlled. Although the isolator 674 is depicted in FIG. 6 shaped as an annular ring, the shape of the isolator 674 may take any number of forms.

An optional thermally conductive paste or adhesive (not shown) may be disposed on between the base 664 and the electrostatic chuck 666. The conductive paste facilitates heat exchange between the electrostatic chuck 666 and the base 664. In one exemplary embodiment, the adhesive mechanically bonds the electrostatic chuck 666 to base 664. Alternatively (not shown), the pedestal assembly 616 may include a hardware (e.g., clamps, screws, and the like) adapted for fastening the electrostatic chuck 666 to the base 664.

The temperature of the electrostatic chuck 666 and the base 664 is monitored using a plurality of sensors. In the embodiment depicted in FIG. 6, a first temperature sensor 690 and a second temperature sensor 692 are shown in a radially spaced orientation such that the first temperature sensor 690 may provide the controller 650 with a metric indicative of the temperature of a center region of the pedestal assembly 616 while the second temperature sensor 692 provide the controller 640 with a metric indicative of the temperature of a perimeter region of the pedestal assembly 616.

The electrostatic chuck 666 is disposed on the base 664 and is circumscribed by a cover ring 648. The electrostatic chuck 666 may be fabricated from aluminum, ceramic or other materials suitable for supporting the substrate 614 during processing. In one embodiment, the electrostatic chuck 666 is ceramic. Alternatively, the electrostatic chuck 666 may be replaced by a vacuum chuck, mechanical chuck, or other suitable substrate support.

The electrostatic chuck 666 is generally formed from ceramic or similar dielectric material and comprises at least one clamping electrode 680 controlled using a chucking power source 682. The electrode 680 (or other electrode disposed in the chuck 666 or base 664) may optionally be coupled to one or more RF power sources for maintaining a plasma formed from process and/or other gases within the processing chamber 600. In the embodiment depicted in FIG. 6, the electrode 680 is coupled to an RF power source and matching circuit 684 capable of producing an RF signal suitable for maintaining a plasma formed from the process gases within the chamber.

The electrostatic chuck 666 may also include a plurality of gas passages (not shown), such as grooves, that are formed in a substrate supporting surface of the chuck and fluidly coupled to a source (also not shown) of a heat transfer (or backside) gas. In operation, the backside gas (e.g., helium (He)) is provided at controlled pressure into the gas passages to enhance the heat transfer between the electrostatic chuck 666 and the substrate 614. Conventionally, at least the substrate supporting surface of the electrostatic chuck is provided with a coating resistant to the chemistries and temperatures used during processing the substrates.

Figure 7:
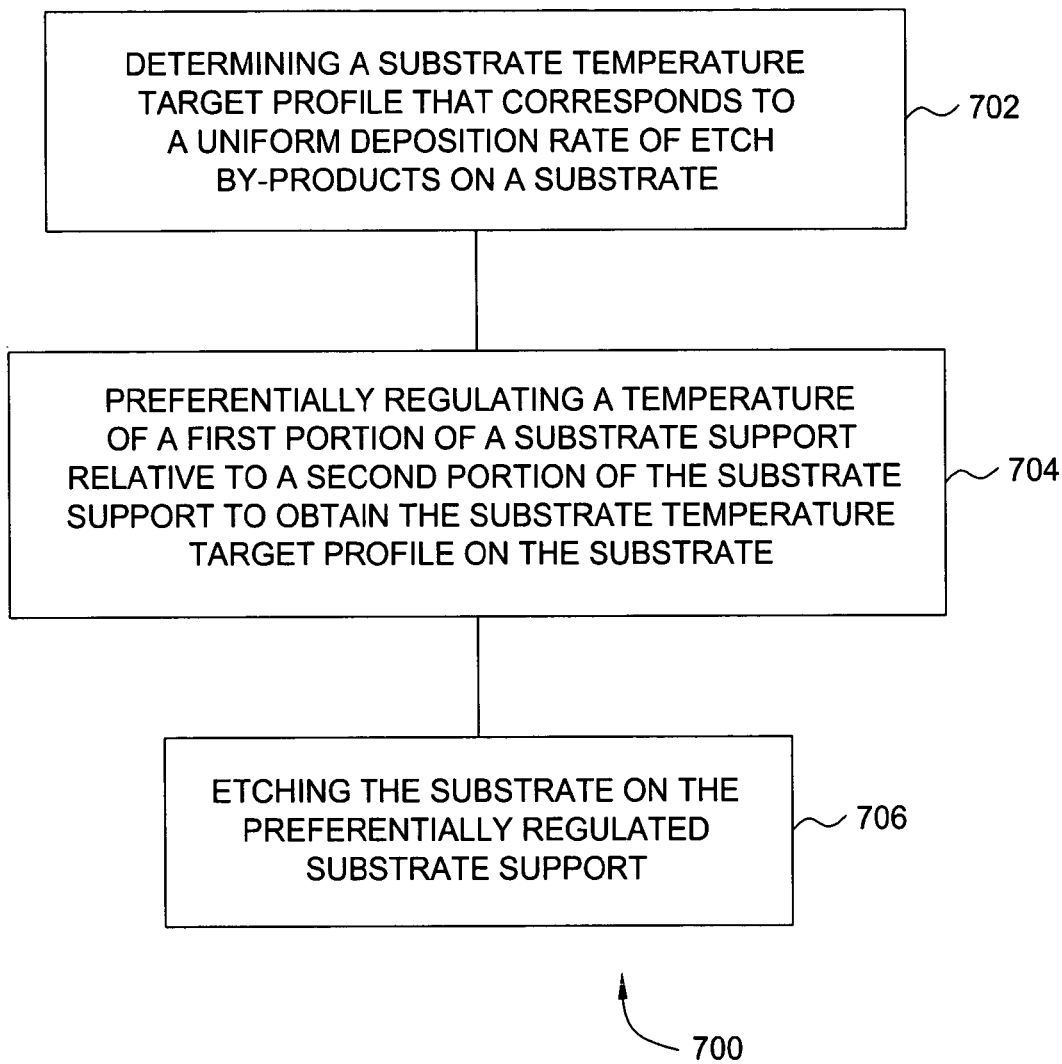
FIGS. 7-9 are a flow diagrams of embodiments of etch processes that may be practiced in the chamber of FIG. 6, or other suitable processing chamber.
Figure 8:
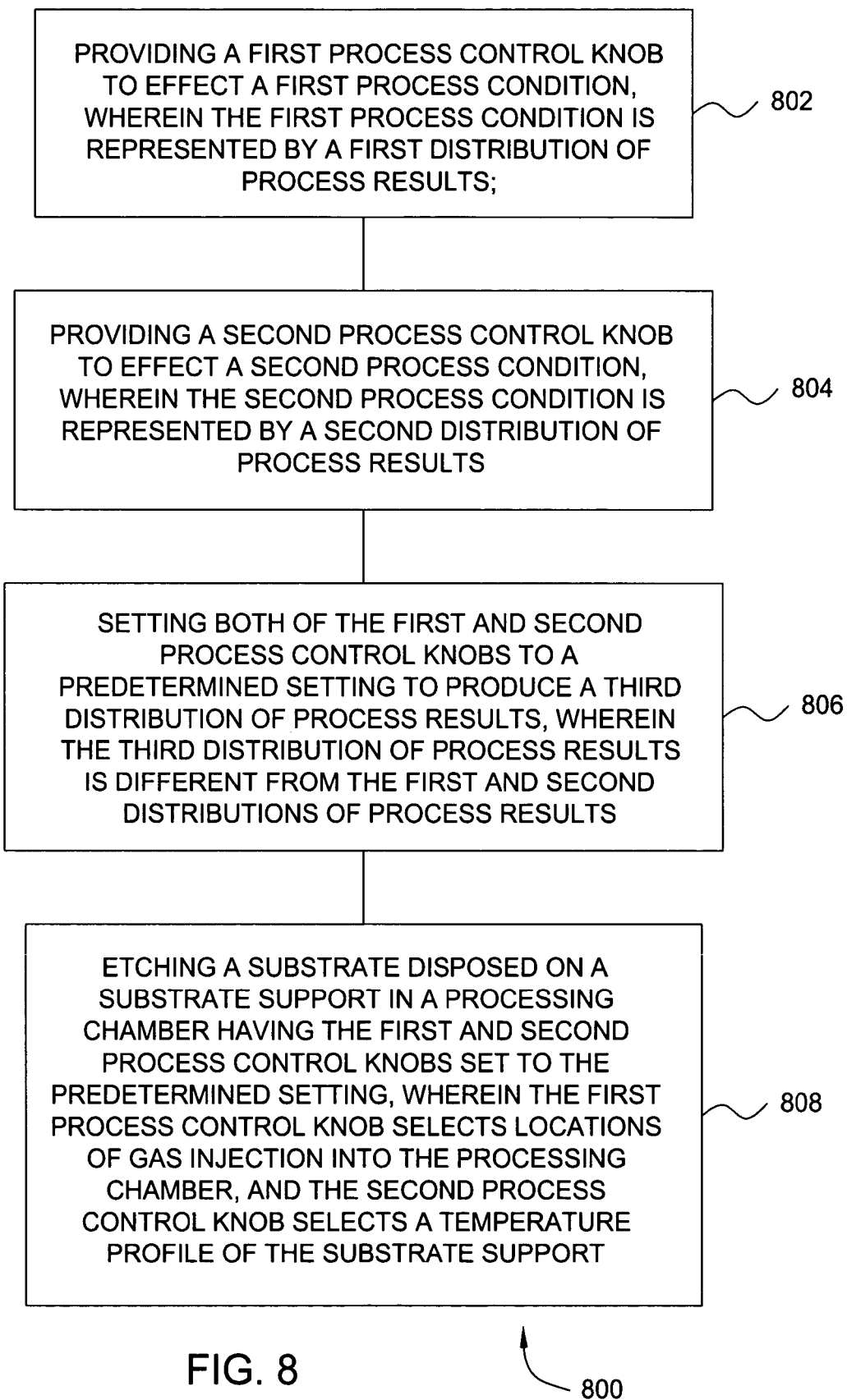
Figure 9:
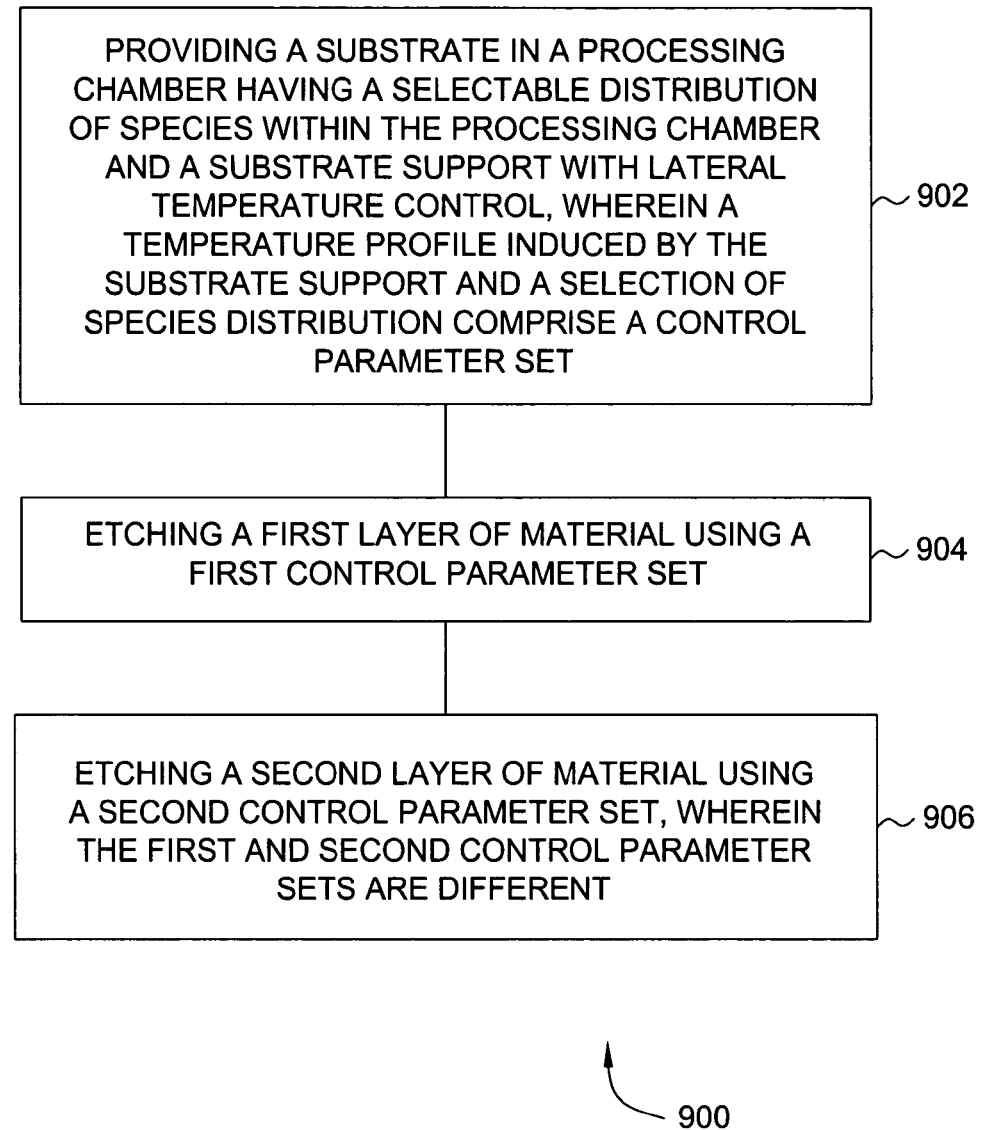

FIGS. 7-9 are a flow diagrams of embodiments of etch processes 700, 800, 900 that may be practiced in the chamber 100, or other suitable processing chamber. Each process may be utilized to fabricate structures depicted in FIGS. 10A-F and 11A-B. Although the processes 700, 800, 900 are illustrated for forming a gate structure in FIGS. 10A-F and a shallow trench isolation (STI) structure in FIGS. 11A-C, the processes may also be beneficially utilized to etch other structures. The processes 700, 800, 900 may be utilized to control the lateral distribution of etch process results. For example, the processes 700, 800, 900 may be utilized to produce a substantially uniform center to edge distribution of etch process results, wherein the process results include at least one of etch depth, CD bias, microloading, sidewall profile, passivation, etch rate, step coverage, feature taper angles and undercutting, among others.

The process 700 of FIG. 7 begins at step 702 by determining a substrate temperature target profile that corresponds to a uniform deposition rate of etch by-products on a substrate.

At step 704, a temperature of a first portion of a substrate support is preferentially regulated relative to a second portion of the substrate support to obtain the substrate temperature target profile on the substrate. At step 706, the substrate is etched on the preferentially regulated substrate support.

The process 800 of FIG. 8 begins at step 802 by providing a first process control knob to effect a first process condition, wherein the first process condition is represented by a first distribution of process results. At step 804, a second process control knob to effect a second process condition is provided, wherein the second process condition is represented by a second distribution of process results. At step 806, both of the first and second process control knobs are set to a predetermined setting to produce a third distribution of process results, wherein the third distribution of process results is different from the first and second distributions of process results. At step 808, a substrate disposed on a substrate support in a processing chamber having the first and second process control knobs set to the predetermined setting is etched, wherein the first process control knob selects locations of gas injection into the processing chamber, and the second process control knob selects a temperature profile of the substrate support.

The process 900 of FIG. 900 begins at step 902 by providing a substrate in a processing chamber having a selectable distribution of species within the processing chamber and a substrate support with lateral temperature control, wherein a temperature profile induced by the substrate support and a selection of species distribution comprise a control parameter set. At step 904, a first layer of material is etched using a first control parameter set. At step 906, etching a second layer of material is etched using a second control parameter set, wherein the first and second control parameter sets are different. It is contemplated that the method 900 may be practiced during incremental etching of a single layer, wherein each incremental etch step is treated as a layer etching step.

The etching methods 700, 800, 900 may be utilized to fabricate a gate structure, as illustrated in the sequence of FIGS. 10A-F. It is contemplated that the setting and/or adjustment of control knobs, species distribution, process gas flow orientation, process gas injection position and temperature profile of the substrate and/or substrate support may be implemented during the etching of any one of the layers of the films stack 1000 or between etching respective layers.

Figures 10A, 10D:
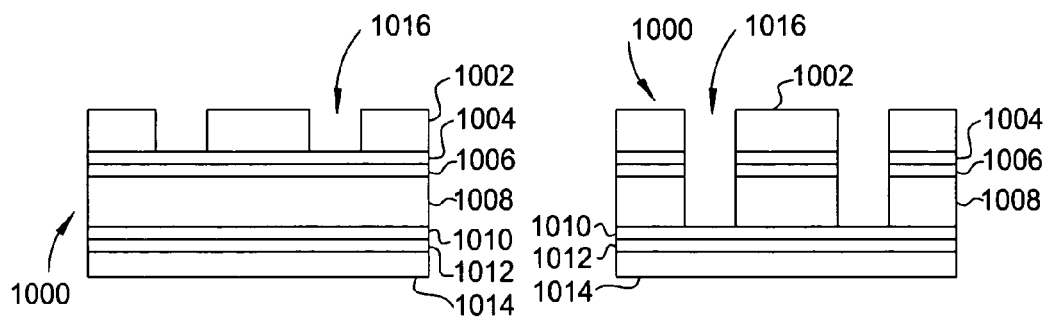
FIGS. 10A-F illustrate one embodiment of a sequence for fabricating a structure that may be etched using the method of FIG. 7, FIG. 8 and/or the method of FIG. 9.

Referring first to FIG. 10A, a film stack 1000 is provided that includes a photoresist layer 1002, a BARC layer 1004, a hardmask layer 1006, a gate electrode layer 1008 and a gate dielectric layer disposed on a substrate 1014. The gate dielectric layer may include a high-k layer 1010 and an optional underlying polysilicon layer 1012. The substrate 1014 may be any one of semiconductor substrates, silicon substrates, glass substrates and the like. The layers that comprise the film stack 1000 may be formed using one or more suitable conventional deposition techniques, such as atomic layer deposition (ALD), physical vapor deposition (PVD), chemical vapor deposition (CVD), plasma enhanced CVD (PECVD), and the like. The film stack 1000 may be deposited using the respective processing modules of CENTURA®, PRODUCER®, ENDURA® and other semiconductor substrate processing systems available from Applied Materials, Inc. of Santa Clara, Calif., among other module manufacturers. In the embodiment shown in FIG. 10A, portions of the BARC layer 1004 are expose through one or more openings 1016 formed in the patterned photoresist layer 1002. The film stack is etched through the openings 1016 to define the gate structure.

Figures 10B, 10E:
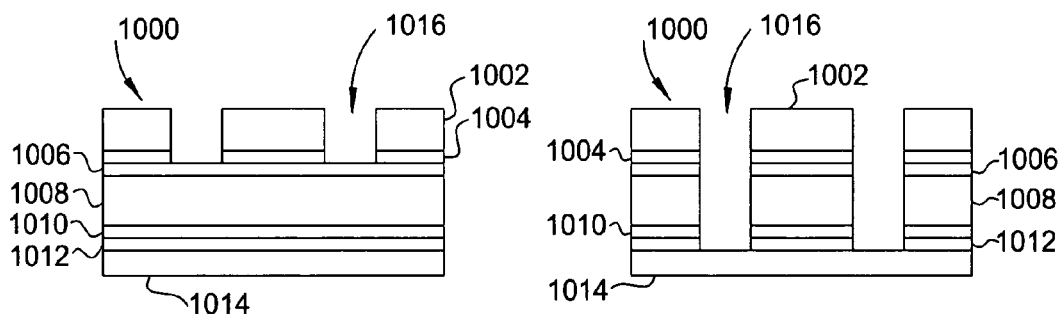
Figures 10C, 10F:
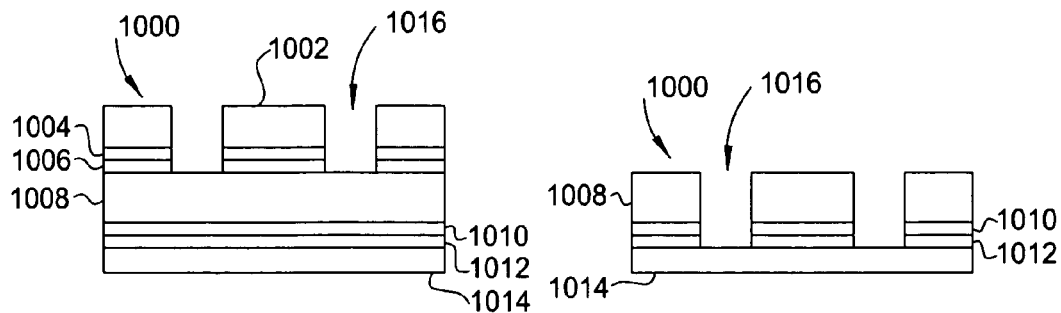

Etching of the film stack 1000 includes first etching the BARC layer 1004. The BARC 1004 layer is typically an organic material utilized to facilitate patterning the photoresist layer 1002. During etching of the BARC layer 1004, the flow of process gases into the processing chamber may be split about equally between the first outlet port 604 and the second outlet port 606 to control the distribution of species within the processing chamber. In other embodiments, etching of the BARC layer 1004 may range from providing 100 percent of the flow from the outlet port 604 to providing 100 percent of the flow from the outlet port 606, including entire range of port 604 to port 606 flow ratios defined therebetween. After the BARC layer 1004 has been etched as shown in FIG. 10B, the opening 1016 is utilized to etch the hard mask layer 1006 as shown in FIG. 10C.

The hard mask layer 1006 may be $SiO_2$, $SiO_3$, SiON or other suitable material. During etching of the hard mask layer 1006, at least about 50 percent of the process gas flow entering the processing chamber may be provided from the outlet port 606. In other embodiments, the hard mask layer etch may utilize substantially equal flow distribution between the outlet ports 604, 606, or a ratio of about 25:75 between the ports 604, 606. In another embodiment, the process gas flow is preferentially provided from the outlet port 606. Once the hard mask layer 1006 has been etched, the gate electrode layer 1008 is etched as shown in FIG. 10D.

The gate electrode layer 1008 may comprise a polysilicon layer or a metal layer disposed on a polysilicon layer. The polysilicon layer may be α-Si or c-Si. Suitable metal layers for use in the gate electrode layer 1008 include tungsten (W), tungsten nitride (WN), tungsten silicide (WSi), tungsten polysilicon (W/poly), tungsten alloy, tantalum (Ta), tantalum nitride (TaN), tantalum silicon nitride (TaSiN), titanium nitride (TiN), alone or combinations thereof.

Etching of the gate electrode layer 1008 may be segmented into main, soft landing and over etch steps. Each of these steps may have one or more processing parameters set differently in accordance with the invention. For example, the main and soft landing steps may flow process gases preferentially through the outlet port 604, while the over etch step provides substantially equal flow between the outlet ports 604, 606. In other embodiments, the over etch step may preferentially flow process gases through the outlet port 606. Process gases suitable for etching the gate electrode layer 1008 generally include at least one of HBr, $BCl_3$, HCl, chlorine gas ($Cl_2$), nitrogen trifluoride ($NF_3$), sulfur hexafluoride gas ($SF_6$), and carbon and fluorine containing gas, such as $CF_4$, $CHF_3$, $C_4F_8$, among others.

Several process parameters are regulated while etching. In one embodiment, the chamber pressure regulated between about 2 mTorr to about 100 mTorr. RF source power may be applied to maintain a plasma formed from the process gas in the range of about 100 Watts to about 1500 Watts.

Following etching to the gate electrode layer 1008, the gate dielectric layer is etched. Suitable examples of gate dielectric layer materials include, but not limited to, an oxide layer, a nitrogen-containing layer, a composite of oxide and nitrogen-containing layer, at least one or more oxide layers sandwiching a nitrogen-containing layer, among others. In one embodiment, the gate dielectric layer material is a high-k material (high-k materials have dielectric constants greater than 4.0). Examples of high-k materials include hafnium dioxide ($HfO_2$), zirconium dioxide ($ZrO_2$), hafnium silicon oxide ($HfSiO_2$), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In the embodiment depicted in FIGS. 10A-E, the gate dielectric layer is shown as a high-k layer 1010 and a polysilicon layer 1012. The polysilicon layer 1012 may be etched as discussed above. The high-k layer 1010 may be etched by exposing the layer 1010 to a plasma comprising carbon monoxide and a halogen containing gas. After etching the gate dielectric layer, the photoresist layer 1002 may be removed as shown in FIG. 10F, using a stripping process, such as by exposure to an oxygen-containing plasma.

Figure 11A:
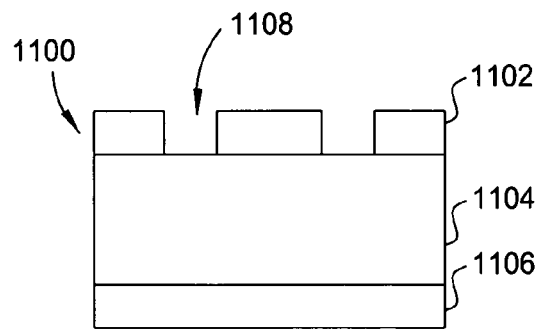
FIGS. 11A-C illustrate one embodiment of a sequence for fabricating a structure that may be etched using the method of FIG. 7, FIG. 8 and/or the method of FIG. 9.
Figure 11B:
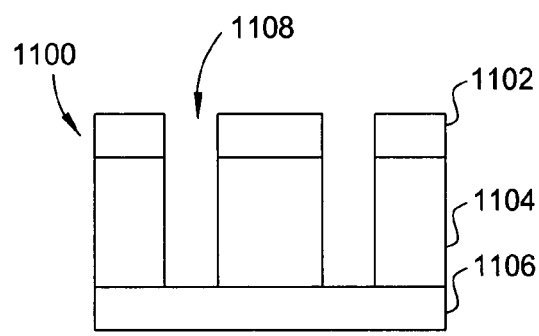
Figure 11C:
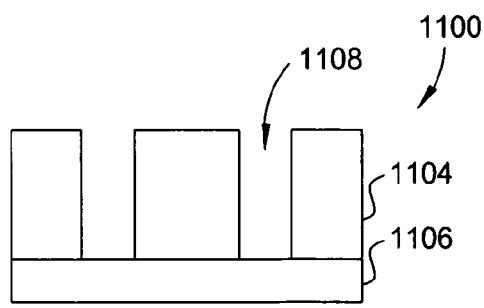

The etching methods 700, 800, 900 may also be utilized to fabricate a a shallow trench isolation (STI) structure, as illustrated in the sequence of FIGS. 11A-C. It is contemplated that the setting and/or adjustment of control knobs, species distribution, process gas flow orientation, process gas injection position and temperature profile of the substrate and/or substrate support may be implemented during the etching of any one of the layers of the films stack or between etching respective layers.

Referring first to FIG. 11A, the film stack 1100 is provided that includes a photoresist layer 1102, and a polysilicon layer 1104 disposed on a substrate 1106. The substrate 1106 may be any one of semiconductor substrates, silicon substrates, glass substrates and the like. In the embodiment shown in FIG. 11A, portions of the polysilicon layer 1104 are exposed through one or more openings 1108 formed in the patterned photoresist layer 1102. The film stack is etched through the openings 1108 to define the shallow trench isolation (STI) structure.

The polysilicon layer 1104 is etched using a halogen-containing gas, such as $Cl_2$, $BCl_3$, HCl, HBr, $CF_4$ and the like, as shown in FIG. 11B. The etching of the polysilicon layer may be performed cyclically with passivation deposition steps. The etching of the polysilicon layer include main etch, soft landing and over etch steps, wherein the methods 700, 800, 900 may be performed at least at any one of the etch steps as discussed above. After etching the polysilicon layer 1104, the photoresist layer 1102 may be removed as shown in FIG. 11C, using a stripping process, such as by exposure to an oxygen-containing plasma.

Thus, an etch process has been provided that enables the control of the distribution of process results laterally across the surface of a substrate. Advantageously, the inventive process enables complimentary process control attributed to be adjusted to obtain substantially uniform center to edge distribution of etch depth, CD bias, microloading, sidewall profile, passivation, etch rate, step coverage, feature taper angles and undercutting and the like.

While the foregoing is directed to embodiments of the present invention, other and further embodiments of the invention may be devised without departing from the basic scope thereof, and the scope thereof is determined by the claims that follow.

What is claimed is:

1. A method for etching a substrate within a processing chamber, comprising:
    injecting a processing gas from a top of the processing chamber in a direction substantially normal to and in a direction substantially parallel to a surface of the substrate, respectively;
    determining a distribution of etch by-products across the surface of the substrate by verifying a flux of species to the surface of the substrate;
    determining a substrate temperature target profile that corresponds to a uniform deposition rate of etch by-products on the substrate;
    correlating the distribution of etch by-products across the surface of the substrate to the substrate temperature target profile;
    preferentially regulating a temperature of a first portion of a substrate support relative to a second portion of the substrate support to obtain the substrate temperature target profile on the substrate; and
    etching the substrate on the preferentially regulated substrate support.

2. The method of claim 1, wherein determining the substrate temperature target profile further comprises:
    utilizing empirical data to generate the substrate temperature target profile.

3. The method of claim 1, wherein injecting the processing gas further comprising:
    predominately flowing the processing gas into the processing chamber in the direction substantially normal to the surface of the substrate.

4. The method of claim 1, wherein etching the substrate further comprising:
    etching a first layer of material with a first predetermined setting using a first distribution of process results; and
    etching a second layer of material with a second predetermined setting using a second distribution of process results, wherein the first and second predetermined settings are different.

5. The method of claim 1, wherein determining the distribution of etch by-product further comprises:
    determining a sticking coefficient for a surface of the substrate.

6. The method of claim 5, wherein determining the substrate temperature target profile further comprises:
    modeling a relation between sticking of etch by-products and substrate temperature; and
    generating the substrate temperature target profile from the model.

7. A method for etching a substrate, comprising:
    providing a first process control knob to effect a first process condition, wherein the first process condition is represented by a first distribution of process results;
    providing a second process control knob to effect a second process condition, wherein the second process condition is represented by a second distribution of process results;
    setting both of the first and second process control knobs to a predetermined setting to produce a third distribution of process results, wherein the third distribution of process results is different from the first and second distributions of process results; and
    etching a substrate disposed on a substrate support in a processing chamber having the first and second process control knobs set to the predetermined setting, wherein the first process control knob selects a ratio of direct to indirect orientation of gas flow into the processing chamber, the direct and indirect orientation of gas are injected from a top of the processing chamber in a direction substantially normal to and substantially parallel to a plane of the substrate, respectively, and wherein the second process control knob selects a temperature profile across a surface of the substrate support.

8. The method of claim 7, wherein setting the first process control knob further comprises:
    predominately flowing gas into the processing chamber in an orientation substantially normal to the plane of the substrate.

9. The method of claim 7, wherein setting the first process control knob further comprises:
    predominately flowing gas into the processing chamber in an orientation substantially parallel to the plane of the substrate.

10. The method of claim 7, wherein setting the first process control knob further comprises:
controlling a local partial pressure of passivation species within the processing chamber.

11. The method of claim 7, wherein setting the second process control knob further comprises:
heating a perimeter portion of the substrate support preferentially relative to a center portion.

12. The method of claim 7, wherein setting the second process control knob further comprises:
cooling a first portion of the substrate support preferentially relative to a second portion.

13. The method of claim 7, wherein etching the substrate further comprises:
etching a polysilicon layer or a metal layer disposed on a polysilicon layer to form a high aspect ratio feature.

14. The method of claim 7, wherein
the ratio of direct to indirect orientation of gas flow is between about 50:50 and about 0:100.

15. The method of claim 7, further comprising:
selecting the first and second process control knobs to produce a substantially uniform center to edge distribution of process results, wherein the process results include at least one of etch depth, CD bias, microloading, sidewall profile, passivation, etch rate, step coverage, feature taper angles and undercutting.

16. The method of claim 7, wherein setting the second process control knob further comprises:
heating a center portion of the substrate support preferentially relative to a perimeter portion.

17. The method of claim 7, wherein the indirect orientation of gas is injected into the processing chamber at an incidence angle of less than or equal to about 60 degrees relative to the plane of the substrate.

18. The method of claim 7, wherein etching the substrate further comprises:
a) etching a BARC layer;
b) etching a hard mask layer; and
c) etching a gate electrode layer, wherein at least two of the etching steps a-c are performed at different settings for at least one of the first and second process control knobs.

19. The method of claim 18, wherein etching the gate electrode layer further comprises:
etching a polysilicon layer.

20. The method of claim 19, wherein etching the gate electrode layer further comprises:
etching a metal material disposed on top of the polysilicon layer.

* * * * *